(12) United States Patent
Kawasumi (10) Patent No.: US 6,806,753 B2
(45) Date of Patent: Oct. 19, 2004

(54) DELAY CIRCUIT AND SYNCHRONOUS DELAY APPARATUS

(75) Inventor: Atsushi Kawasumi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/279,498

(22) Filed: Oct. 25, 2002

(65) Prior Publication Data

US 2003/0128062 A1 Jul. 10, 2003

(30) Foreign Application Priority Data

Oct. 25, 2001 (JP) .................................... 2001-327370

(51) Int. Cl.$^7$ ............................................. H03H 11/23
(52) U.S. Cl. ...................................... 327/261; 327/270
(58) Field of Search ............................... 327/261, 270, 327/264, 271, 276, 277, 284

(56) References Cited

U.S. PATENT DOCUMENTS

| | | | | |
|---|---|---|---|---|
| 5,986,949 A | * | 11/1999 | Toda ........................... | 365/194 |
| 6,198,690 B1 | * | 3/2001 | Kato et al. ................... | 365/233 |
| 6,313,676 B1 | * | 11/2001 | Abe et al. .................... | 327/158 |
| 6,473,865 B1 | * | 10/2002 | Kamoshida et al. ........ | 713/401 |

OTHER PUBLICATIONS

Harold Pilo, et al., "Design–for–Test Methods for Stand–Alone SRAMS at 1Gb/s/pin and Beyond", Test Conference, 2000 Proceedings, International, 2000, pp. 436–443.

* cited by examiner

Primary Examiner—Linh M. Nguyen
(74) Attorney, Agent, or Firm—Oblon, Spivak, McClelland, Maier & Neustadt, P.C.

(57) ABSTRACT

A delay circuit, including a plurality of delay blocks connected in series, each having a first complementary input terminal to which a first complementary signal is inputted, a second complementary input terminal to which a second complementary signal is inputted, and a complementary output terminal which outputs a third complementary signal delaying by selecting one of the first and second complementary signals based on logic of a delay selection signal, the complementary output terminal of the delay blocks except for the delay block of last stage being connected to the second complementary input terminal of the subsequent delay block, respectively, a complementary delay signal delaying the first complementary signal in accordance with logic of the delay selection signal being outputted from the complementary output terminal of the delay block of last stage, and the same first complementary signal is inputted to the first complementary input terminals of the plurality of delay blocks, respectively. One of the plurality of delay blocks connected in series is selected in accordance with logic of the delay selection signal, the selected delay block outputting the third complementary signal delaying the first complementary signal, and a delay block not selected outputting the third complementary signal delaying the second complementary signal.

18 Claims, 5 Drawing Sheets

DELAY CIRCUIT AND SYNCHRONOUS DELAY APPARATUS

CROSS REFERENCE TO RELATED APPLICATIONS

This application is based upon and claims the benefit of priority from the prior Japanese Patent Applications No. 2001-327370, filed on Oct. 25, 2001, the entire contents of which are incorporated herein by reference.

BACKGROUND OF THE INVENTION

1. Field of the Invention

The present invention relates to a delay circuit. Especially, the present invention relates to a delay circuit implemented on a semiconductor integrated circuit.

2. Related Background Art

Figure 9A:
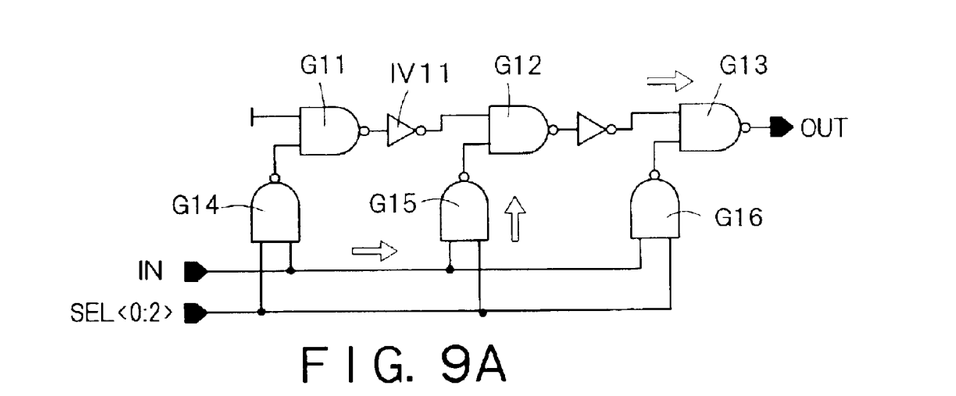
FIG. 9 is a circuit diagram of the conventional variable delay circuit capable of adjusting the delay amount.

The delay circuit on the semiconductor integrated circuit is composed of inverters and the other logic gates. FIG. 9 is a circuit diagram of a conventional variable delay circuit capable of adjusting the delay amount. The variable delay circuit of FIG. 9 adjusts delay time by the number of stages that an input signal IN passes through NAND gates and inverters. NAND gates G14, G15 and G16 are connected to one of input terminals of the NAND gates G11, G12 and G13 connected in series, respectively. An input signal IN is commonly inputted to one input ends of the NAND G14, G15 and G16. Delay selection signals SEL<0>, SEL<1> and SEL<2> are inputted to the other input ends of the NAND gates G14, G15 and G16, respectively.

Figure 9B:
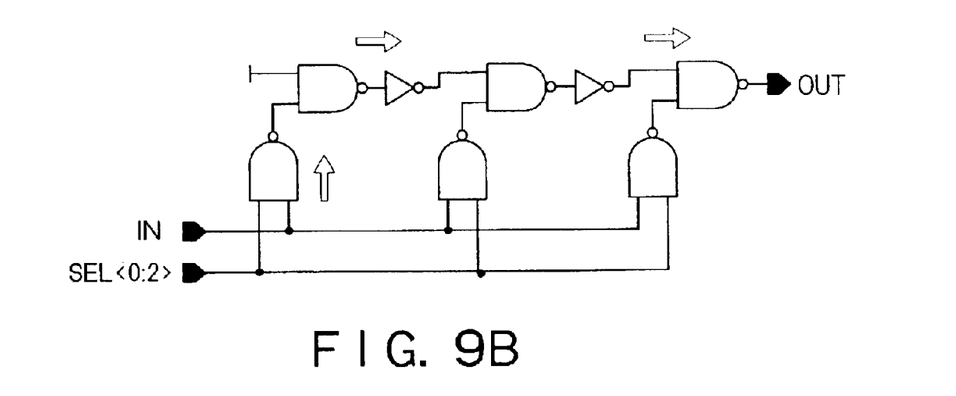

In the variable delay circuit of FIG. 9, when the delay selection signal SEL<0>, SEL<1> and SEL<2> are set to be in low, high and low, respectively, the input signal is propagated along arrows of FIG. 9B. When the delay selection signals SEL<0>, SEL<1> and SEL<2> are set to be in low, low and high, respectively, the input signal is propagated along the arrows of FIG. 9B.

Thus, when only one of the delay selection signals SEL<0>, SEL<1> and SEL<2> is set to be in high level, the number of stages of the gates on the signal propagation path from the input IN to the output OUT changes. As a result, it is possible to adjust the delay time from the input IN to the output OUT.

However, in the variable delay circuit of FIG. 9, when the delay selection signal is switched, the number of stages of the gates that the input signal IN passes through changes two stages at the minimum. That is, the variable delay circuit of FIG. 9 cannot adjust the delay time in units of less than two stages of the gates.

Recently, operational frequency of various semiconductor integrated circuits including a CPU becomes higher. In accordance with speeding-up of the operational frequency of the semiconductor integrated circuits, it is desirable to be able to adjust the delay time of various signals in minute units. If the delay time cannot be adjusted in units of less than two stages of the gates, it is impossible to improve accuracy of the delay time.

SUMMARY OF THE INVENTION

A delay circuit according to one embodiment of the present invention, comprising:

a plurality of delay blocks connected in series, each having a first complementary input terminal to which a first complementary signal is inputted, a second complementary input terminal to which a second complementary signal is inputted, and a complementary output terminal which outputs a third complementary signal delaying by selecting one of said first and second complementary signals based on logic of a delay selection signal, said complementary output terminal of said delay blocks except for said delay block of last stage being connected to said second complementary input terminal of the subsequent delay block, respectively, a complementary delay signal delaying said first complementary signal in accordance with logic of said delay selection signal being outputted from said complementary output terminal of said delay block of last stage, and the same first complementary signal is inputted to said first complementary input terminals of said plurality of delay blocks, respectively.

DESCRIPTION OF THE PREFERRED EMBODIMENTS

Hereinafter, a delay circuit and a synchronous delay apparatus according to the present invention will be more specifically described with reference to drawings.

First Embodiment

Figure 1:
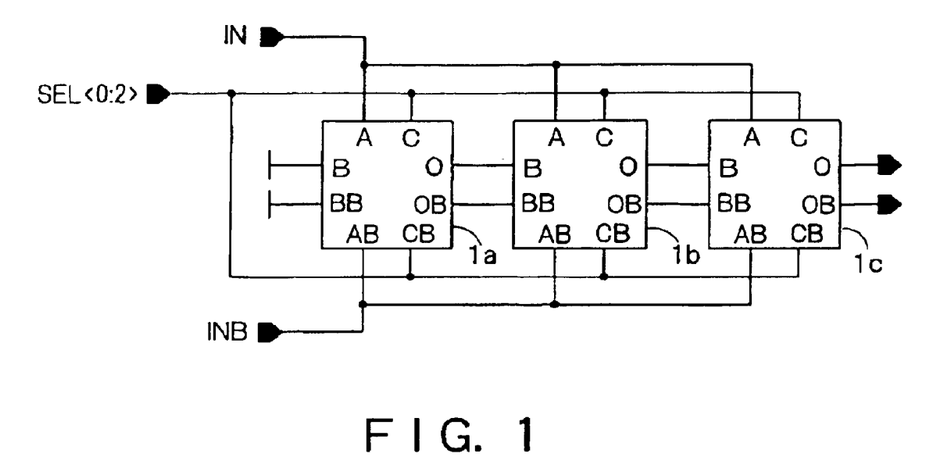
FIG. 1 is a block diagram showing schematic configuration of a first embodiment of a delay circuit according to the present invention.

FIG. 1 is a block diagram showing schematic configuration of a delay circuit according to a first embodiment of the present invention. The delay circuit of FIG. 1 has three delay blocks 1a, 1b and 1c connected in series. Each delay block has a first complementary input terminals A and AB to which first complementary signals (complementary input signals) IN and INB are inputted, second complementary input terminals B and BB to which a second complementary signal is inputted, complementary output terminals O and OB to which a third complementary signal delaying the first and second complementary signals is outputted, and complementary delay selection signal input terminals C and CB to which one of the delay selection signals SEL<0:2> are inputted complementarily.

The complementary output terminals O and OB of the delay blocks 1a and 1b except for a last stage are connected to second complementary input terminals B and BB of the delay blocks 1b and 1c of subsequent stage. The complementary output terminals O and OB of the delay block 1c of the last stage outputs the complementary delay output signal delaying the complementary input signals IN and INB (complementary input signal) in accordance with a logic of the delay selection signals SEL<0:2>. The same complementary input signals IN and INB are inputted to the first complementary input terminals A and AB of the respective delay blocks. The delay selection signal SEL<0> is inputted to the complementary delay selection signal input terminals C and CB of the delay block 1a of the first stage, the delay selection signal SEL<1> is inputted to the complementary delay selection signal input terminals C and CB of the delay block 1b of the second stage, and the delay selection signal SEL<2> is inputted to the complementary delay selection signal input terminals C and CB of the delay block 1c of the last stage. The second complementary input terminals B and BB of the delay block 1a of the first stage is grounded.

Figure 2A:
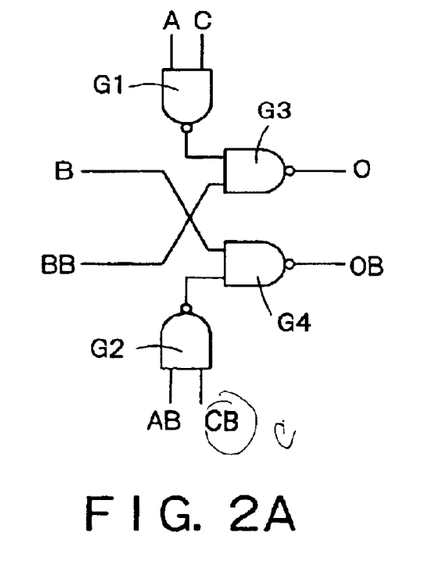
FIG. 2 is a circuit diagram showing internal configuration of each delay block of FIG. 1.
Figure 2B:
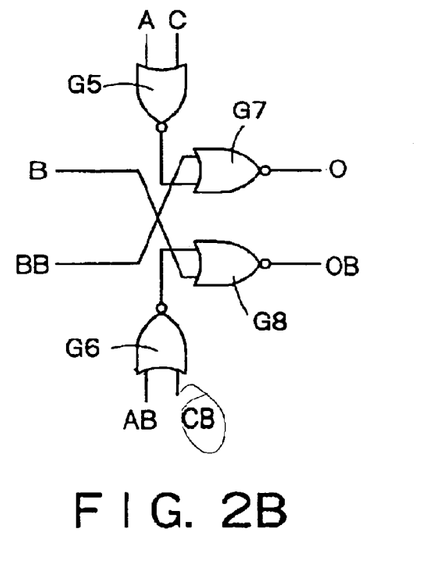

The delay blocks 1a and 1c connected to odd stages are composed of a circuit shown in FIG. 2A, and the delay block 1b connected to even stages is composed of a circuit shown in FIG. 2B.

The delay blocks 1a and 1c of odd stage shown in FIG. 2A has four NAND gates G1–G4. The NAND gate G1 performs NAND operation between one IN of the complementary input signals IN, INB and the delay selection signal, the NAND gate G2 performs NAND operation between the other INB of the complementary input signals IN, INB and the delay selection signal, the NAND gate G3 performs NAND operation between one of the second complementary signals and the output signal of the NAND gate G1, and the NAND gate G4 performs NAND operation between the other of the second complementary signals and the output signal of the NAND gate G2.

The delay block 1b of even stages shown in FIG. 2B has four NOR gates G5–G8. The NOR gate G5 performs NOR operation between one IN of the complementary input signals IN, INB and the delay selection signal. The NOR gate G6 performs the NOR operation between the other INB of the complementary input signals IN, INB and the delay selection signal. The NOR gate G7 performs NOR operation between one of the second complementary signals and the output signal of the NOR gate G5. The NOR gate G8 performs NOR operation between the other of the second complementary signals and the output signal of the NOR gate G6.

Figure 3A:
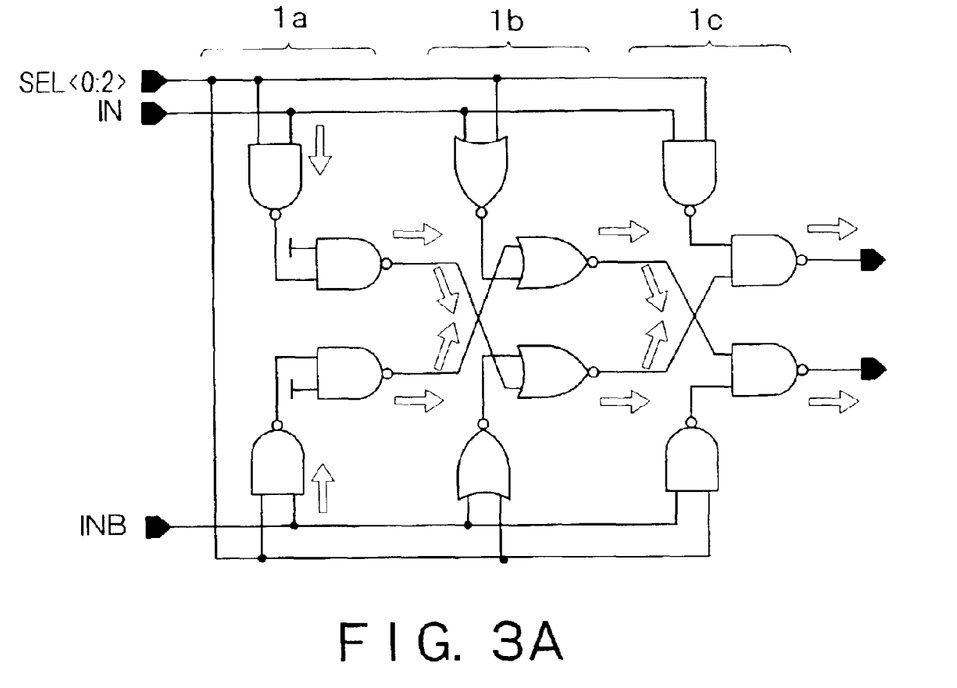
FIG. 3 is a circuit diagram of the delay circuit of FIG. 1.
Figure 3B:
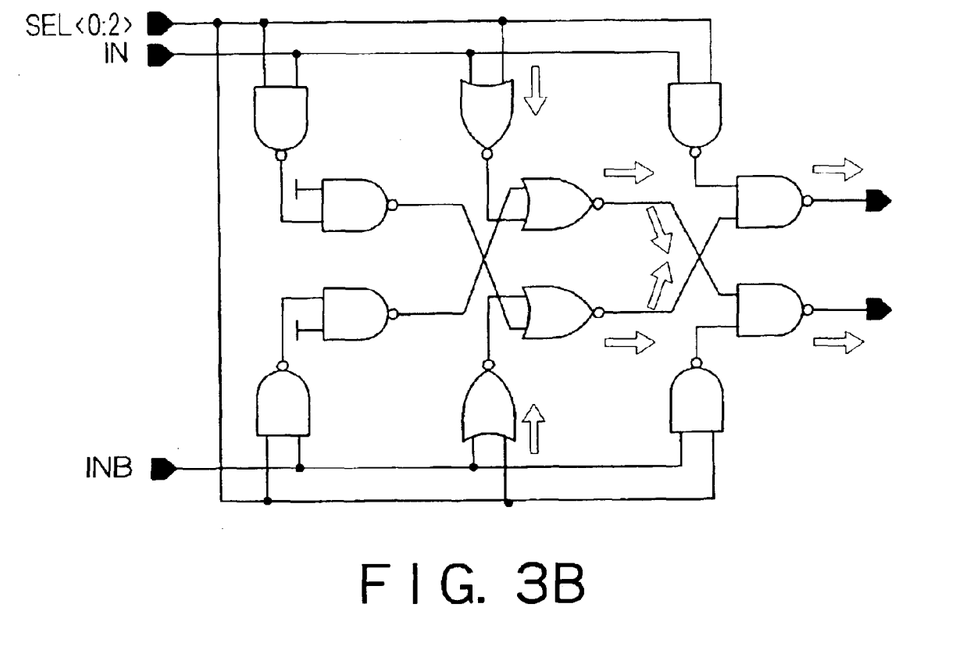

FIG. 3 is a circuit diagram of a delay circuit of FIG. 1. Hereinafter, operation of the present embodiment will be described with reference to FIG. 3. First, when the delay selection signals SEL<0>, SEL<1> and SEL<2> are in high, high and low, the complementary input signals IN and INB are inputted via the NAND gates G1 and G2 in the delay block 1a of the first stage. The complementary input signals IN and INB are propagated along arrows of FIG. 3A. As obvious from FIG. 3A, after the complementary input signals IN and INB are inputted, until the delay signal is outputted from the delay block 1c of last stage, the number of the passed gates is four.

Next, when the delay selection signals SEL<0>, SEL<1> and SEL<2> are low, the complementary input signals IN and INB are inputted via the NOR gates G5 and G6 in the delay block 1b of second stage. The complementary input signals IN and INB are propagated along the arrows of FIG. 3B. As obvious from FIG. 3B, after the complementary input signals IN and INB are inputted, until the delay signal is outputted from the delay block 1c of last stage, the number of stages of the passed gates is three.

Thus, the delay circuit of FIG. 1 selects the delay block for receiving the complementary input signals IN and INB by logic of the delay selection signal SEL<0:2>, delays and outputs the complementary input signal IN and INB received from the selected delay block. Because of this, even if the delay block receiving the complementary input signal IN and INB changes, the logic of the complementary delay signal outputted from the complementary output terminals O and OB does not change, but it is possible to change only the delay amount. That is, because the gate for bringing logic into line is unnecessary, it is possible to decrease the number of stages of gates. More specifically, according to the present embodiment, because it is possible to adjust the delay amount in units of one gate, it is possible to improve the delay accuracy, compared with the conventional delay circuit.

Second Embodiment

In the delay circuit of FIG. 1, the delay path that one of the complementary input signals IN and INB is propagated is independent from the delay path that the other of the complementary input signals IN and INB is propagated. Because of this, due to dispersion of element properties and so on, even if the number of stages of the passed gates is the same, phase lag may occur between the delay signal passing through one of the delay path and the delay signal passing through the other delay path.

A delay circuit of a second embodiment eliminates phase difference between the delay path that one of the complementary input signals IN and INB is propagated, and the delay path that the other of the complementary input signals IN and INB is propagated.

Figure 4:
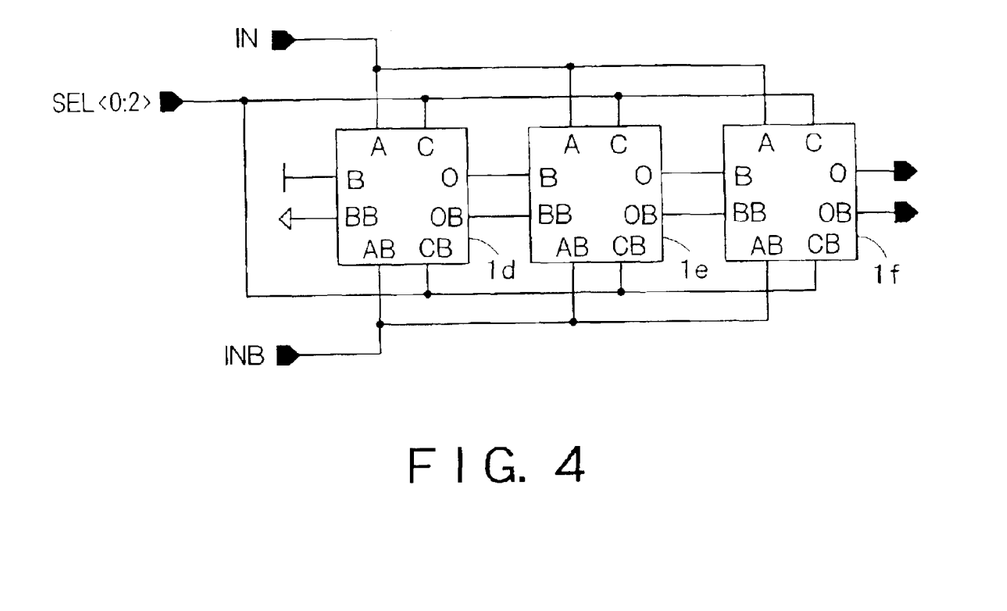
FIG. 4 is a block diagram showing schematic configuration of a delay circuit according to a second embodiment of the present invention.

FIG. 4 is a block diagram showing schematic configuration of a delay circuit according to a second embodiment of the present invention. The delay circuit of FIG. 4 has three delay blocks 1d, 1e and 1f connected in series. Connection relationship of input/output terminals of each delay block is the same as that of FIG. 1. A power supply voltage terminal is connected to one of a second complement input terminals B and BB of the delay block 1d of the first stage, and the other of the second complement input terminals B and BB is grounded.

Figure 5:
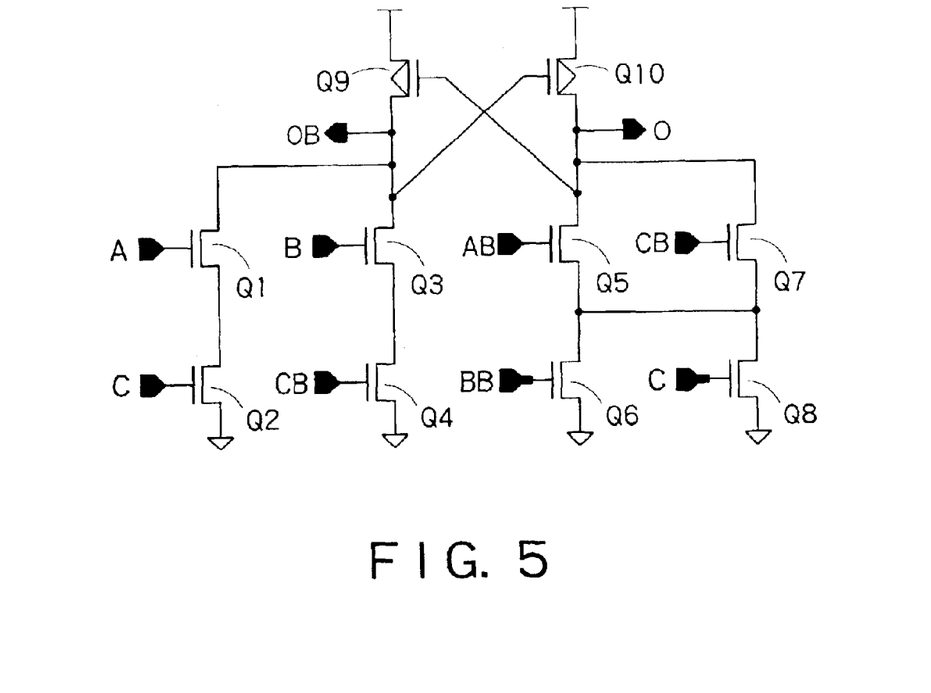
FIG. 5 is a circuit diagram showing internal configuration of each delay block of FIG. 4.

FIG. 5 is a circuit diagram showing internal configuration of the respective delay blocks 1d–1f. As shown in FIG. 5, each of the delay blocks is composed of a DCVSL (Differential Cascade Voltage Switch Logic), and outputs a complementary output signal which is obtained by delaying the complementary input signals IN and INB by only the delay amount in accordance with logic of the delay selection signals SEL<0:2>.

The delay blocks of FIG. 5 has first and second transistors Q1, Q2 connected in series between one OB of the complementary output terminals O, OB and the ground terminal, third and fourth transistors Q3, Q4 connected in series between one OB of the complementary output terminals O, OB and the ground terminal, fifth and sixth transistors Q5, Q6 connected in series between the other O of the complementary output terminal O, OB and the ground terminal, seventh and eighth transistors Q7, Q8 connected in series between the other O of the complementary output terminals O, OB and the ground terminal, a ninth transistor Q9 connected between one OB of the complementary output terminal O, OB and the power supply terminal, and a tenth transistor Q10 connected between the other of the complementary output terminal O, OB and the power supply terminal.

One A of the first complementary input terminals A and AB is connected to the gate terminal of the first transistor Q1, one of the complementary delay selection signal is inputted to the gate terminal of the second transistor Q2, one B of the second complementary input terminals B, BB is connected to the gate terminal of the third transistor Q3, the other of the complementary delay selection signal is inputted to the gate terminal of the fourth transistor Q4, the other AB of the first complementary input terminals A, AB is connected to the gate terminal of the fifth transistor Q5, the other BB of the second complementary input terminals B, BB is connected to the gate terminal of the sixth transistor Q6, the other of the complementary delay selection signal is inputted to the gate terminal of the seventh transistor Q7, one of the complementary delay selection signals is inputted to the gate terminal of the eighth transistor Q8, the other 0 of the complementary output terminals O and OB is connected to the gate terminal of the ninth transistor Q9, and one OB of the complementary output terminals O and OB is connected to the gate terminal of the tenth transistor Q10.

The delay circuit of FIG. 4 also adjusts the delay time by switching the delay block inputting the complementary input signals IN and INB in accordance with logic of the delay selection signals SEL<0:2>, similarly to the delay circuit of FIG. 1. Even if the logics of the delay selection signals SEL<0:2> are changed, the output logic of each delay block does not change.

Figure 6A:
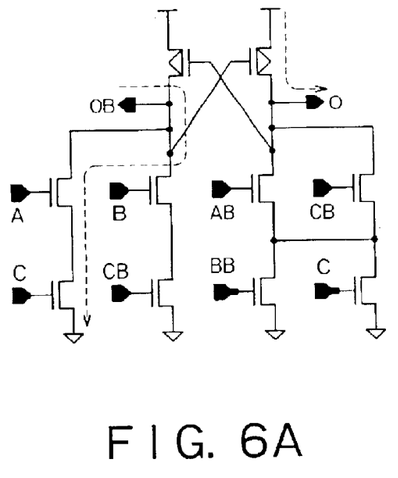
FIG. 6 is a diagram showing the direction in which the electric current flows through by arrows when the delay selection signal is in high.
Figure 6B:
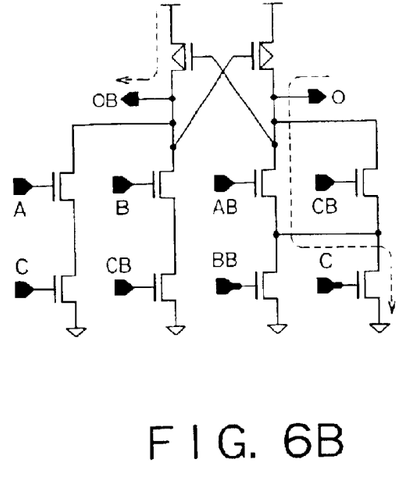

FIG. 6 is a diagram showing a direction through which electric current flows when the delay selection signal is in high level. When one IN of the complementary input signals IN and INB is in high level, the electric current flows through along arrows of FIG. 6A. When one IN of the complementary input signals IN and INB is in low, the electric current flows through along arrows of FIG. 6B.

Figure 7A:
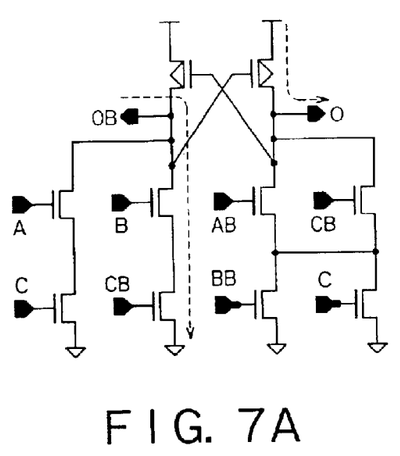
FIG. 7 is a diagram showing the direction in which the electric current flows through by arrows when the delay selection signal is in low.
Figure 7B:
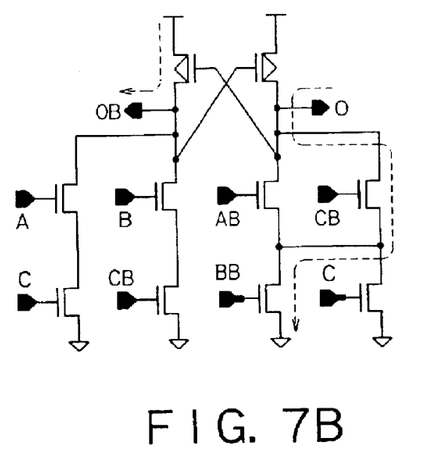

FIG. 7A is a diagram showing direction that electric current flows through when the delay selection signal is in low. When one B of the second complementary signal is in high, the electric current flows through along the arrows of FIG. 7A. Furthermore, when one B of the second complementary signal is in low, the electric current flows through along the arrows of FIG. 7B.

As obvious from these drawings, the delay after the logic of the complementary input signal IN and INB changes, until the output logic of the delay block changes, is equal to the delay of one stage of the transistor. Thus, the delay circuit according to the present embodiment can adjust the delay amount in units of one stage of the transistor.

Furthermore, the delay blocks 1d–1f of FIG. 5 transmits the signal while the delay path of one of the complementary input signals IN and INB interacts with the other delay path. Because of this, the phase lag seen as a problem in the first embodiment does not occur. Accordingly, the delay circuit of FIG. 4 is suitable for the circuit such as an SMD (Synchronous Mirror Delay) circuit and an SAD (Synchronous Asynchronous Delay) circuit, in which a lot of delay elements are necessary.

Figure 8:
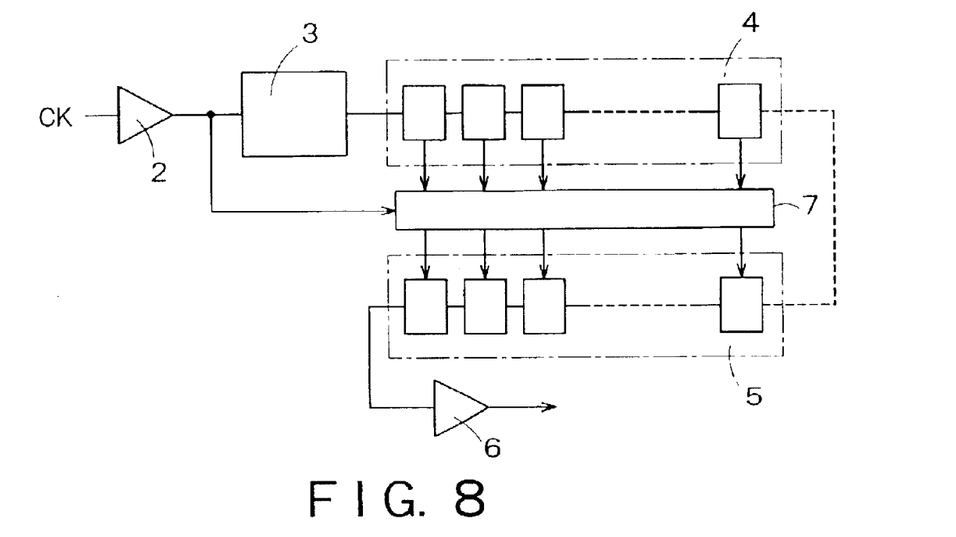
FIG. 8 is a block diagram showing one example of an SAD circuit.

FIG. 8 is a block diagram showing an example of the SAD circuit. The SAD circuit of FIG. 8 has an input buffer 2 to which an input clock signal CK is inputted, a delay monitor circuit 3 connected to the output terminal of the input buffer 2, a first delay element group 4 consisted of a plurality of delay elements connected to the output terminal of the delay monitor circuit 3, a second delay element group 5 consisted of a plurality of delay elements connected to the output terminal of the first delay element group 4, an output buffer 6 connected to the output terminal of the second delay element group 5, and a control circuit 7 for controlling delay time of the first and second delay element groups 4 and 5.

The SAD circuit of FIG. 8 synchronizes the output clock signal outputted from the output buffer 6 with the input clock signal by canceling out the delay amount at the input buffer 2 and the output buffer 6 by the first and second delay element groups 4 and 5 and the delay monitor circuit 3. The output clock signal is outputted by delaying two cycles from the input clock signal.

The first and second delay element groups 4 and 5 may be configured by connecting many delay elements in series. Even in such a case, if the delay circuit of FIG. 4 is used as the delay element, the complementary input signals IN and INB are propagated while two delay paths interact with each other. Because of this, the phase lag does not occur, and it is possible to improve the delay accuracy.

The example in which three delay blocks are connected in series has been described in the above embodiment. However, the number of the delay blocks connected in series is not limited. Furthermore, in FIG. 2, although the example in which the delay blocks 1a–1c are consisted of the NAND gates and the NOR gates has been described, the delay blocks 1a–1c may been consisted of gates of the other types. In FIG. 5, although the example in which the delay blocks 1d–1f are consisted of a DCVSL using transistors of NMOS type and transistors of PMOS type has been described. However, the conduction type of these transistors and the means constituting logic may be modified.

What is claimed is:

1. A synchronous delay circuit, comprising:
   a plurality of delay blocks connected in series, each having a first complementary input terminal to which a first complementary signal is inputted, a second complementary input terminal to which a second complementary signal is inputted, and a complementary output terminal which outputs a third complementary signal delaying by selecting one of said first and second complementary signals based on logic of a delay selection signal,
   said complementary output terminal of said delay blocks except for said delay block of last stage being connected to said second complementary input terminal of the subsequent delay block, respectively,
   a complementary delay signal delaying said first complementary signal in accordance with logic of said delay selection signal being outputted from said complementary output terminal of said delay block of last stage, and
   the same first complementary signal is inputted to said first complementary input terminals of said plurality of delay blocks, respectively, and
   one of said plurality of delay blocks connected in series being selected in accordance with logic of said delay selection signal, the selected delay block outputting said third complementary signal delaying said first complementary signal, and a delay block not selected outputting said third complementary signal delaying said second complementary signal.

2. The delay circuit according to claim 1, wherein even if logic of said delay selection signal changes, each of said plurality of delay blocks outputs said third complementary signal of the same logic.

3. The delay circuit according to claim 1, wherein said plurality of delay blocks connected in series can adjust the delay time in units of the delay amount of one gate.

4. The delay circuit according to claim 1, wherein said delay blocks of odd stages among said plurality of delay blocks connected in series are composed of a first gate group consisted of a plurality of gates; and said delay blocks of even stages among said plurality of delay blocks connected in series are composed of a second gate group which is consisted of a plurality of gates and has circuit configuration different from said first gate group.

5. The delay circuit according to claim 4, wherein one of said first and second gate groups includes:

a first NAND gate which performs NAND operation between the signal inputted to one of said first complementary input terminals and said delay selection signal;

a second NAND gate which performs NAND operation between the signal inputted to the other of said first complementary input terminals and said delay selection signal;

a third NAND gate which performs NAND operation between one of said second complementary input terminal and the output terminals of said first NAND gate; and a fourth NAND gate which performs NAND operation between the other of said second complementary input terminals and the output terminal of said second NAND gate; and the other of said first and second gate groups includes:

a first NOR gate which performs NOR operation between the signal inputted to one of said first complementary input terminals and said delay selection signal;

a second NOR gate which performs NOR operation between the signal inputted to the other of said first complementary input terminals and the delay selection signal;

a third NOR gate which performs NOR operation between one of said second complementary input terminals and the output terminal of said first NOR gate; and a fourth NOR gate which performs NOR operation between the other of said second complementary input terminals and the output terminal of said second NOR gate, the output terminals of said third and fourth NAND gates and the output terminals of said third and fourth NOR gates are connected to said complementary output terminal of the corresponding delay block.

6. The delay circuit according to claim 1, wherein said plurality of delay blocks connected in series adjusts the delay time in units of input/output delay amount of one transistor.

7. The delay circuit according to claim 6, wherein said plurality of delay blocks connected in series are composed so that a delay path that one of said first complementary signals is propagated is interacted with a delay path that the other of said first complementary signals is propagated.

8. The delay circuit according to claim 6, further comprising:

first and second transistors connected in series between one of said complementary output terminals and a first reference voltage terminal;

third and fourth transistors connected in series between one of said complementary output terminals and said first reference voltage terminal;

fifth and sixth transistors connected in series between the other of said complementary output terminals and said first reference voltage terminal;

seventh and eighth transistors connected in series between the other of said complementary output terminals and first reference voltage terminal;

a ninth transistor connected between one of said complementary output terminals and said second reference voltage terminal; and a tenth transistor connected between the other of said complementary output terminals and said second reference voltage terminal, wherein one of said first complementary input terminals is connected to the gate terminal of said first transistor;

one of complementary delay selection signals relating to said delay selection signal is inputted to the gate terminal of said second transistor;

one of said second complementary input terminals is connected to the gate terminal of said third transistor;

the other of said complementary delay selection signals is inputted to the gate terminal of said fourth transistor;

the other of said first complementary input terminals is connected to the gate terminal of said fifth transistor;

the other of said second complementary input terminals is connected to the gate terminal of said sixth transistor;

the other of said complementary delay selection signals is inputted to the gate terminal of said seventh transistor;

one of said complementary delay selection signals is inputted to the gate terminal of said eighth transistor;

the other of said complementary output terminals is connected to the gate terminal of said ninth transistor; and one of said complementary output terminals is connected to the gate terminal of said tenth transistor.

9. The delay circuit according to claim 1, wherein a signal with a predetermined logic is inputted to said second complementary input terminal of said delay block of first stage among said plurality of delay blocks connected in series.

10. A synchronous delay apparatus, comprising:

an input buffer to which an input clock signal is inputted;

a delay monitor circuit connected to an output terminal of said input buffer;

a first delay element group consisted of a plurality of delay elements connected to an output terminal of said delay monitor circuit;

a second delay element group consisted of a plurality of delay elements connected to an output terminal of said first delay element group;

an output buffer connected to an output terminal of said second delay element group; and a control circuit which controls delay time of said first and second delay element groups, wherein said delay monitor circuit has delay amount relating to the delay amounts of said first and second delay element groups;

each of said delay elements composing said first and second delay element groups includes:

a plurality of delay blocks connected in series, each having a first complementary input terminal to which a first complementary signal is inputted, a second complementary input terminal to which a second complementary signal is inputted, and a complementary output terminal which outputs a third complementary signal delaying by selecting one of said first and second complementary signals based on logic of a delay selection signal, said complementary output terminal of said delay blocks except for said delay block of last stage being connected to said second complementary input terminal of the subsequent delay block, respectively, a complementary delay signal delaying said first complementary signal in accordance with logic of said delay selection signal being outputted from said complementary output terminal of said delay block of last stage, and the same first complementary signal is inputted to said first complementary input terminals of said plurality of delay blocks, respectively, and one of said plurality of delay blocks connected in series being selected in accordance with logic of said delay selection signal, the selected delay block outputting said third complementary signal delaying said first complementary signal, and a delay block not selected outputting said third complementary signal delaying said second complementary signal.

11. The synchronous delay apparatus according to claim 10, wherein even if logic of said delay selection signal changes, each of said plurality of delay blocks outputs said third complementary signal of the same logic.

12. The synchronous delay apparatus according to claim 10, wherein said plurality of delay blocks connected in series can adjust the delay time in units of the delay amount of one gate.

13. The synchronous delay apparatus according to claim 10, wherein said delay blocks of odd stages among said plurality of delay blocks connected in series are composed of a first gate group consisted of a plurality of gates; and said delay blocks of even stages among said plurality of delay blocks connected in series are composed of a second gate group which is consisted of a plurality of gates and has circuit configuration different from said first gate group.

14. The synchronous delay apparatus according to claim 13, wherein one of said first and second gate groups includes:

a first NAND gate which performs NAND operation between the signal inputted to one of said first complementary input terminals and said delay selection signal;

a second NAND gate which performs NAND operation between the signal inputted to the other of said first complementary input terminals and said delay selection signal;

a third NAND gate which performs NAND operation between one of said second complementary input terminals and the output terminal of said first NAND gate; and a fourth NAND gate which performs NAND operation between the other of said second complementary input terminals and the output terminal of said second NAND gate; and the other of said first and second gate groups includes:

a first NOR gate which performs NOR operation between the signal inputted to one of said first complementary input terminals and said delay selection signal;

a second NOR gate which performs NOR operation between the signal inputted to the other of said first complementary input terminals and the delay selection signal;

a third NOR gate which performs NOR operation between one of said second complementary input terminals and the output terminal of said first NOR gate; and a fourth NOR gate which performs NOR operation between the other of said second complementary input terminals and the output terminal of said second NOR gate, the output terminals of said third and fourth NAND gates and the output terminals of said third and fourth NOR gates are connected to said complementary output terminal of the corresponding delay block.

15. The synchronous delay apparatus according to claim 10, wherein said plurality of delay blocks connected in series adjusts the delay time in units of input/output delay amount of one transistor.

16. The synchronous delay apparatus according to claim 15, wherein said plurality of delay blocks connected in series are composed so that a delay path that one of said first complementary signals is propagated is interacted with a delay path that the other of said first complementary signals is propagated.

17. The synchronous delay apparatus according to claim 15, further comprising:

first and second transistors connected in series between one of said complementary output terminals and a first reference voltage terminal;

third and fourth transistors connected in series between one of said complementary output terminals and said first reference voltage terminal;

fifth and sixth transistors connected in series between the other of said complementary output terminals and said first reference voltage terminal;

seventh and eighth transistors connected in series between the other of said complementary output terminals and first reference voltage terminal;

a ninth transistor connected between one of said complementary output terminals and said second reference voltage terminal; and a tenth transistor connected between the other of said complementary output terminals and said second reference voltage terminal, wherein one of said first complementary input terminals is connected to the gate terminal of said first transistor;

one of complementary delay selection signals relating to said delay selection signal is inputted to the gate terminal of said second transistor;

one of said second complementary input terminals is connected to the gate terminal of said third transistor;

the other of said complementary delay selection signals is inputted to the gate terminal of said fourth transistor;

the other of said first complementary input terminals is connected to the gate terminal of said fifth transistor;

the other of said second complementary input terminals is connected to the gate terminal of said sixth transistor;

the other of said complementary delay selection signals is inputted to the gate terminal of said seventh transistor;

one of said complementary delay selection signals is inputted to the gate terminal of said eighth transistor;

the other of said complementary output terminals is connected to the gate terminal of said ninth transistor; and one of said complementary output terminals is connected to the gate terminal of said tenth transistor.

18. The synchronous delay apparatus according to claim 10, wherein a signal with a predetermined logic is inputted to said second complementary input terminal of said delay block of first stage among said plurality of delay blocks connected in series.

* * * * *